United States Patent [19]

Morita

[11] Patent Number: 5,100,830

[45] Date of Patent: Mar. 31, 1992

[54] METHOD OF MANUFACTURING A SEMICONDUCTOR DEVICE

[75] Inventor: Shigeru Morita, Kawasaki, Japan

[73] Assignee: Kabushiki Kaisha Toshiba, Kawasaki, Japan

[21] Appl. No.: 480,899

[22] Filed: Feb. 16, 1990

[30] Foreign Application Priority Data

Feb. 22, 1989 [JP] Japan .................................. 1-42410

[51] Int. Cl.⁵ .............................................. H01L 21/76
[52] U.S. Cl. ...................................... 437/64; 437/69;
  437/70; 437/89; 437/90
[58] Field of Search ....................... 437/69, 70, 89, 90,
  437/63, 64

[56] References Cited

U.S. PATENT DOCUMENTS

| 4,746,625 | 5/1988 | Morita et al. | 437/63 |
| 4,948,456 | 8/1990 | Schubert | 437/90 |
| 4,948,748 | 8/1990 | Kitahara et al. | 437/90 |
| 4,948,751 | 8/1990 | Okamoto | 437/90 |

FOREIGN PATENT DOCUMENTS

| 61-244042 | 10/1986 | Japan | 437/69 |
| 2198882 | 6/1988 | United Kingdom | 437/70 |

Primary Examiner—Olik Chaudhuri
Assistant Examiner—G. Fourson
Attorney, Agent, or Firm—Finnegan, Henderson, Farabow, Garrett and Dunner

[57] ABSTRACT

In a method for manufacturing a semiconductor device using a LOCOS technique, a selective oxidation is performed using an oxidation-resistance film as a mask to form an element isolating oxide film on the semiconductor substrate. An inserting portion of the oxide film is formed under an end portion of the oxidation-resistance film. The feature of this method lies in that the inserting portion of the oxide film is left as an element isolating oxide film and the other portion thereof is removed to selectively expose the substrate, and then a monocrystalline silicon layer is formed on the exposed portion of the substrate and used as an element region.

14 Claims, 5 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device in which element isolation is performed by forming an insulation film such as an oxide film between element regions.

2. Description of the Related Art Oxidation of Silicon) technique has

A LOCOS (Local been well-known as a method for isolating elements in a high-density semiconductor integrated circuit. The LOCOS technique is as follows: The surface of a semiconductor substrate is oxidized to form a surface-protecting insulation film. An oxidation-resistance film, e.g., a silicon nitride film is formed on the insulation film and it is then subjected to patterning. The semiconductor substrate is selectively oxidized using the silicon nitriding film as a mask thereby to form a thick element isolating insulation film on the substrate.

In the LOCOS technique, when the selective oxidization is carried out, an inserting portion of the element isolating insulation film, called a bird's beak, is formed below the silicon nitride film which is used as a mask. The bird's beak causes an error in dimension between the silicon nitride film and element isolating insulation film. The error in dimension particularly depends on the thickness of the surface-protecting insulation film. The thicker the surface-protecting insulation film, the larger the bird's beak. For example, in a semiconductor device using a silicon substrate as the semiconductor substrate and a silicon oxide film as the surface-protecting insulation film, if the thickness of a silicon nitride film is 250 nm, the thickness of the silicon oxide film is 150 nm, the thickness of an element isolating insulation film obtained before removing the silicon nitride film and silicon oxide film is 800 nm and the thickness of the insulation film obtained after removing them is 500 to 600 nm, the error in dimension is about 1.2 to 1.6 μm. For this reason, in order to obtain electrically satisfactory element isolation characteristics using the LOCOS technique, the width of a practical element isolation region is at least 2.0 μm and it cannot be made smaller than 2.0 μm.

SUMMARY OF THE INVENTION

The present invention has been made in consideration of the above situation and its object is to provide a method for manufacturing a semiconductor device wherein the above-described drawback of the conventional method using a LOCOS technique is eliminated and thus a thin element isolating insulation film can be formed.

According to the present invention, there is provided a method of manufacturing a semiconductor device, comprising the steps of:

forming a surface-protecting film on a semiconductor substrate and then forming an oxidation-resistance film on the surface-protecting film;

selectively removing the oxidation-resistance film by photoetching;

doping conductivity inversion preventing impurities into the semiconductor substrate, using a remaining oxidation-resistance film having a predetermined pattern as a mask;

forming an element isolating oxide film on the semiconductor substrate so that an inserting portion of the element isolating oxide film is formed under an end portion of the remaining oxidation-resistance film by a selective oxidation technique using the remaining oxidation-resistance film having a predetermined pattern as a mask;

removing a portion other than the inserting portion of the element isolating oxide film by anisotropic etching using the oxidation-resistance film having a predetermined pattern, thereby selectively exposing the semiconductor substrate;

forming a monocrystalline silicon layer on the exposed portion of the semiconductor substrate;

removing the oxidation-resistance film having a predetermined pattern and the surface-protecting film to selectively expose the semiconductor substrate; and monocrystalline silicon layer and in the exposed portion of the semiconductor substrate.

According to the present invention, there is provided another method of manufacturing a semiconductor device comprising the steps of:

forming a surface-protecting film on a semiconductor substrate and then forming an oxidation-resistance film on the surface-protecting film;

selectively removing the oxidation-resistance film by photoetching;

doping conductivity inversion preventing impurities into the semiconductor substrate, using a remaining oxidation-resistance film having a predetermined pattern as a mask;

forming an element isolating oxide film on the semiconductor substrate so that an inserting portion of the element isolating oxide film is formed under an end portion of the remaining oxidation-resistance film by a selective oxidation technique using the remaining oxidation-resistance film having a predetermined pattern as a mask;

removing a portion other than the inserting portion of the element isolating oxide film by anisotropic etching using the oxidation-resistance film having a predetermined pattern, thereby selectively exposing the semiconductor substrate;

selectively removing a layer into which the conductivity inversion preventing impurities are doped, by anisotropic etching using the oxidation-resistance film having a predetermined pattern as a mask;

forming a monocrystalline silicon layer on the exposed portion of the semiconductor substrate;

removing the oxidation-resistance film having a predetermined pattern and the surface-protecting film to selectively expose the semiconductor substrate; and forming semiconductor elements in the monocrystalline silicon layer and in the exposed portion of the semiconductor substrate.

In the method of manufacturing a semiconductor device according to the present invention, the selective oxidation is performed using an oxidation-resistance film as a mask to form an element isolating oxide film on the semiconductor substrate. An inserting portion of the oxide film is formed under an end portion of the oxidation-resistance film. The feature of this method lies in that the inserting portion of the oxide film is left as an element isolating oxide film and the other portion thereof is removed to selectively expose the substrate, and then a monocrystalline silicon layer is formed on the exposed portion of the substrate and used as an element region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will be described with reference to the accompanying drawings. FIGS. 1A to 1G are cross-sectional views which are used for explaining a method of manufacturing a semiconductor device according to the first embodiment of this invention and which show the structures of the device in respective manufacturing processes.

Figure 1A:
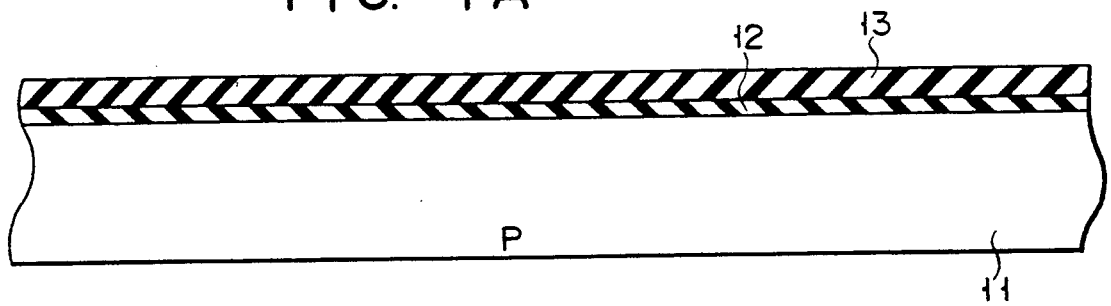
FIGS. 1A to 1G are cross-sectional views showing the respective processes of a semiconductor device manufactured by a method according to the first embodiment of the present invention.

Referring to FIG. 1A, p-type silicon semiconductor substrate 11 whose resistivity is about 1 to 2 $\Omega$cm is oxidized in an oxidizing atmosphere of about 1000° C. to form silicon oxide film 12 having a thickness of about 150 nm serving as a surface-protecting film, on substrate 11. Silicon nitride film 13 of about 250 nm in thickness, serving as a oxidation-resistance film, is then formed on silicon oxide film 12 by the CVD (Chemical Vapor Deposition) technique.

Figure 1B:
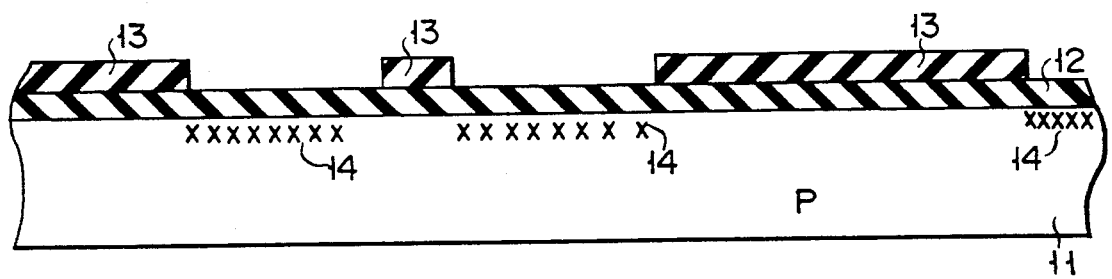

As shown in FIG. 1B, silicon nitride film 13 is selectively etched by photoetching to remove a portion thereof on an element region and then using the remaining portion having a predetermined pattern of silicon nitride film 13 as a mask, boron is ion-implanted as p-type impurities for preventing inversion of conductivity into silicon substrate 11 on an acceleration voltage of about 100 KeV and at a dose of about $5 \times 10^{13}/cm^2$, thereby selectively forming ion-implantation layer 14 for preventing inversion of conductivity on the surface of silicon substrate 11.

Figure 1C:
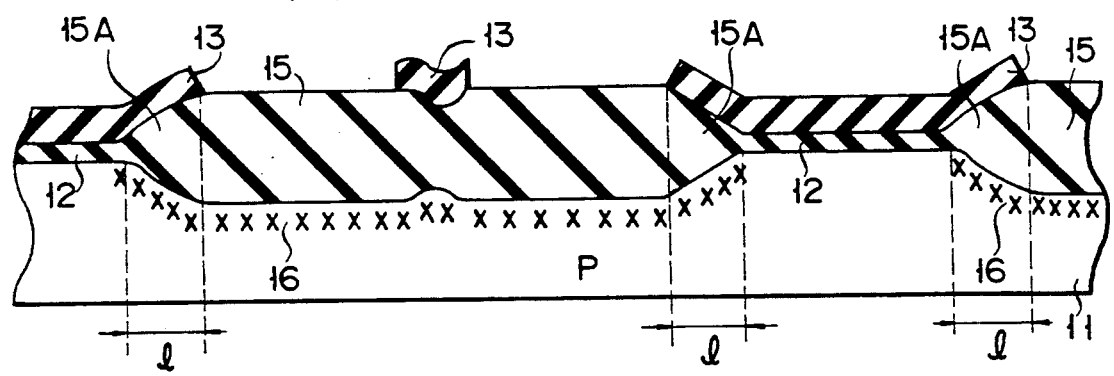

As illustrated in FIG. 1C, silicon substrate 11 is thermally treated at about 1000C.° in an atmosphere of mixed gas of $H_2$ gas and $O_2$ gas, using silicon nitride film 13 as a mask, and thus it is selectively oxidized to form silicon oxide film 15 of about 800 nm in thickness serving as an element-isolating insulation film. Width l of an inserting portion, i.e., bird's beak 15A of element-isolating insulation film 15, formed under an end portion of silicon nitride film 13, is about 0.6 $\mu$m. Since the bird's beak is formed all over an end portion of insulation film 15, the error in dimension due to the bird's beak is about 1.2 $\mu$m. During the thermal treatment, the boron within ionimplantation layer 14 is thermally diffused into silicon substrate 11, and conductivity inversion preventing layer 16 is formed in the entire interface region of silicon substrate 11 contacting element-isolating insulation film 15.

Figure 1D:
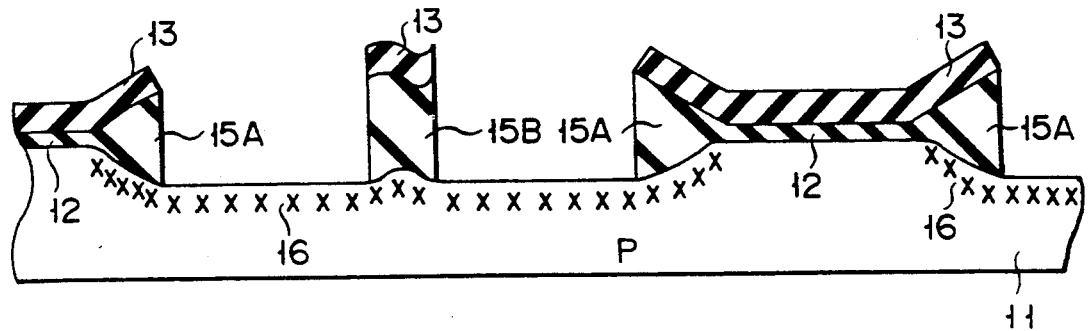

As shown in FIG. 1D, insulation film 15 is selectively removed by anisotropic etching using silicon nitride film 13 as a mask to selectively expose substrate 11 with only portions 15A and 15B under silicon nitride film 13 remaining. Since the width of silicon nitride film 13 on element-isolating insulation film 15B is extremely small, the inserting portion of insulation film 15, formed under an end portion of silicon nitride film 13, overlaps silicon nitride film 13. The thickness of insulation film 15B is approximate to that of the end portion.

Figure 1E:
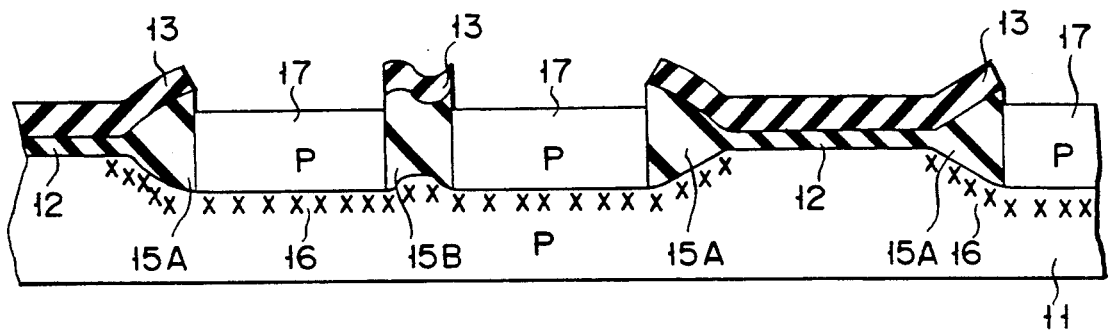

As shown in FIG. 1E, monocrystalline silicon layer 17 is formed on the exposed portion of substrate 11 by the low-temperature epitaxial growth technique having selectivity. In this epitaxial growth process, p-type impurities having the same conductivity type as that of substrate 11, e.g., boron is mixed into a reactive gas and thus the conductivity type of monocrystalline silicon layer 17 becomes a p type. In this process, the heating temperature is set at about 400° C. so as not to diffuse the boron in conductivity inversion preventing layer 16 again. Monocrystalline silicon layer 17 is formed thicker by the thickness of silicon oxide film 12 than an end portion of element-isolating insulation film 15A so that monocrystalline silicon layer 17 virtually matches the upper surface of element-isolating insulation film 15A when silicon oxide film 12 is removed in the subsequent manufacturing process.

Figure 1F:
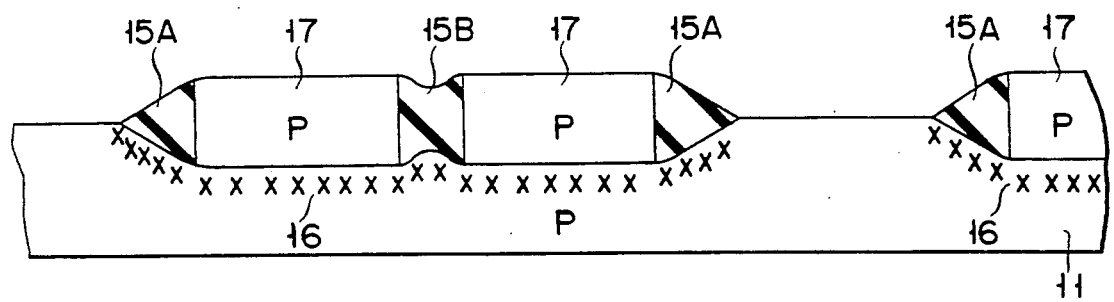

After that, as illustrated in FIG. 1F, silicon nitride film 13 is removed by CDE (chemical dry etching) and silicon oxide film 12 is then removed by an $NH_4F$ solution to selectively expose substrate 11. Since, as described above, monocrystalline silicon layer 17 is formed thicker by the thickness of silicon oxide film 12 than an end portion of element-isolating insulation film 15A, the upper surfaces of monocrystalline silicon layer 17 and element-isolating insulation film 15A in their contact portion are at substantially the same level and virtually no difference in level between them occurs.

Figure 1G:
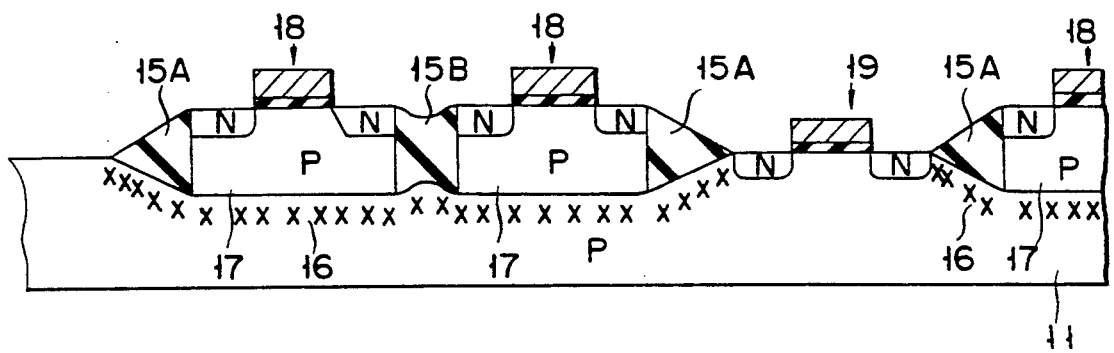

As shown in FIG. 1G, an element such as N-channel MOS transistor 18 and a bipolar transistor (not shown) is formed in monocrystalline silicon layer 17 by a well-known manufacturing process, and also an element such as N-channel MOS transistor 19 and a bipolar transistor (not shown) is formed in the exposed region of substrate 11 by a well-known manufacturing process.

According to the above embodiment, oxide film 15 formed under an end portion of silicon nitride film 13 serving as an oxidation-resistance film remains as element-isolating insulation films 15A and 15B. It is thus possible to form a minute element-isolating region which is defined by the minimum width of silicon nitride film 13 and to minutely set the width of an element region made of monocrystalline silicon layer 17. For example, the minimum width of element-isolating insulation film 15B can be set at about 0.5 $\mu$m which is the limited value in the field of lithography. The width of the element region made of mono-crystalline silicon layer 17 ca be almost equal to that of film 15B.

Since substrate 11 and monocrystalline silicon layer 17 are connected to each other via element-isolating insulation film 15A whose surface has a gentle slope, there occurs no difference in level between them. For this reason, there is not any fear of causing any stepping even though a wiring layer is formed on insulation film 15A.

A method of manufacturing a semiconductor device according to the second embodiment of the present invention will be next described. The manufacturing processes of the first embodiment, shown in FIGS. 1A to 1D, are the same as those of the second embodiment and accordingly the descriptions therefor are omitted. The processes subsequent to that shown in FIG. D will be described with reference to accompanying FIGS. 2A to 2D.

Figure 2A:
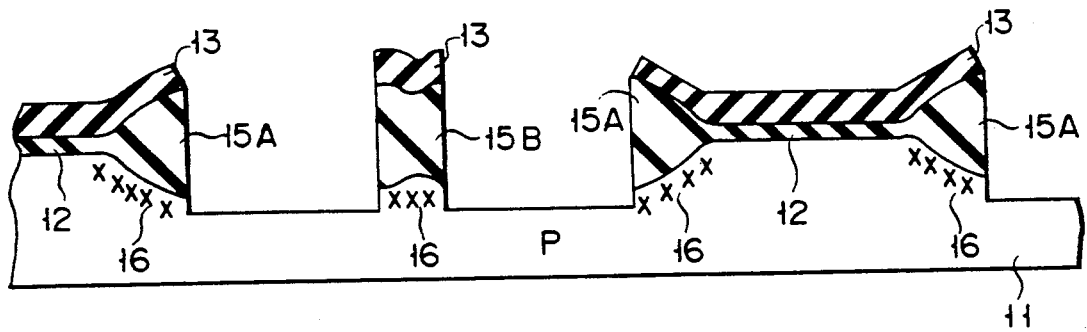
FIGS. 2A to 2D are cross-sectional view showing respective processes of a semiconductor device manufactured by a method according to the second embodiment of the present invention.

As shown in FIG. 2A, substrate 11 is selectively etched by anisotropic etching using silicon nitride film 13 as a mask and conductivity inversion preventing layer 16 is selectively removed, thereby selectively exposing substrate 11.

Figure 2B:
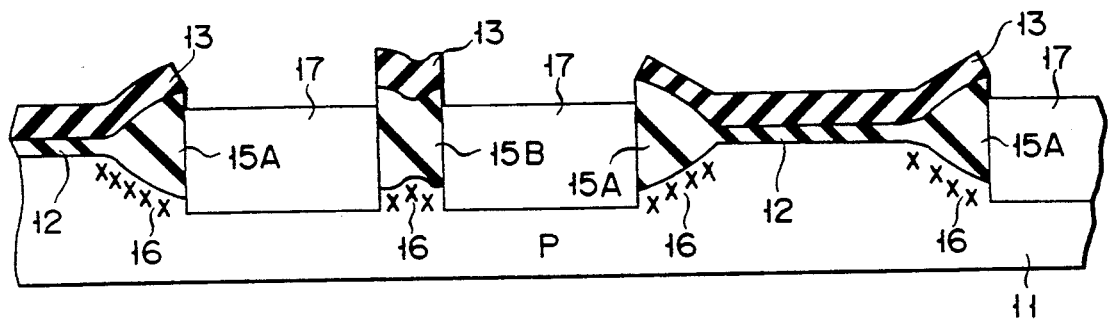

As shown in FIG. 2B, p-type monocrystalline silicon layer 17 for an element region is formed on the exposed portion of substrate 11 by the low-temperature epitaxial growth technique having selectiveness and, in this case, the heating temperature is about 400C°. Like in the first embodiment mentioned above, monocrystalline silicon layer 17 is formed thicker by the thickness of silicon oxide film 12 than an end portion of element-insulation film 15A so that monocrystalline silicon layer 17 virtually matches the upper surface of element-isolating insulation film 15A when silicon oxide film 12 is removed in the subsequent manufacturing process.

Figure 2C:
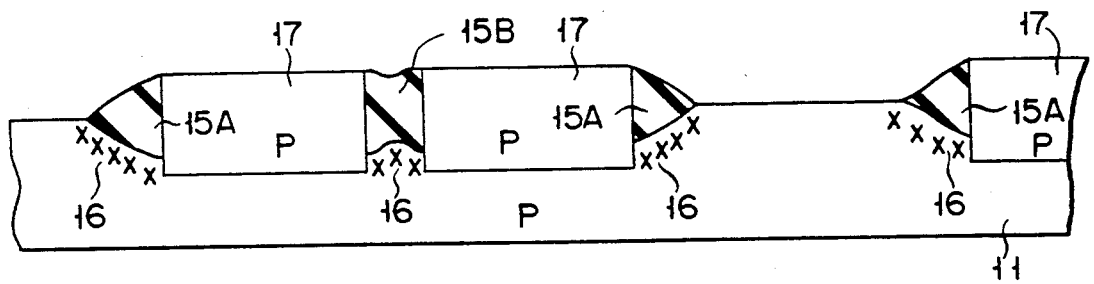

Subsequently, as illustrated in FIG. 2C, silicon nitride film 13 is removed by CDE (chemical dry etching) and silicon oxide film 12 is then removed by an NH$_4$F solution to selectively expose substrate 11. As mentioned above, since the thickness of monocrystalline silicon layer 17 is smaller than that of an end portion of element-isolating insulation film 15A by the thickness of silicon oxide film 12, layer 17 and film 15A contact each other so that they are almost flush with each other at the contact point and there occurs no stepping.

Figure 2D:
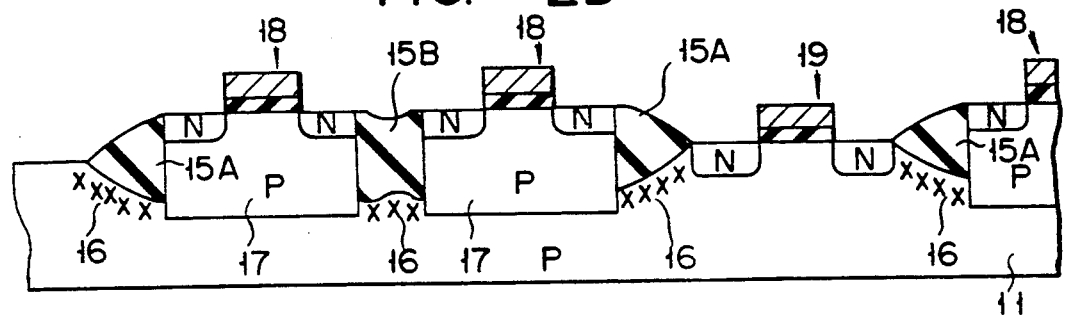

As shown in FIG. 2D, using a well-known manufacturing process, an element such as N-channel MOS transistor 18 and a bipolar transistor (not shown) is formed in monocrystalline silicon layer 17 and also an element such as N-channel MOS transistor 19 and a bipolar transistor (not shown) is formed i the exposed region of substrate 11.

The manufacturing method according to the second embodiment is an addition of a process shown in FIG. 2A to the method according to the first embodiment. More specifically, substrate 11 is etched more deeply after element-isolating insulation film 15 is selectively removed. Therefore, conductivity inversion preventing layer 16 is not formed under the lower surface of monocrystalline silicon layer 17 but only under the lower surfaces of element-isolating insulation films 15A and 15B. For this reason, when conductivity inversion preventing layer 16 is formed, an adverse influence on the elements, e.g., the back-gate effect, can be suppressed.

Figure 3:
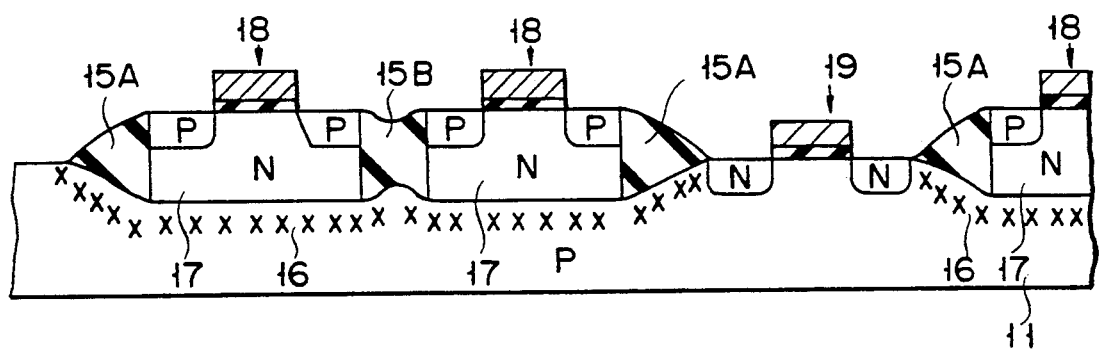
FIGS. 3 to 6 are cross-sectional views showing a semiconductor device in manufacturing processes according to another embodiment of the present invention.
Figure 4:
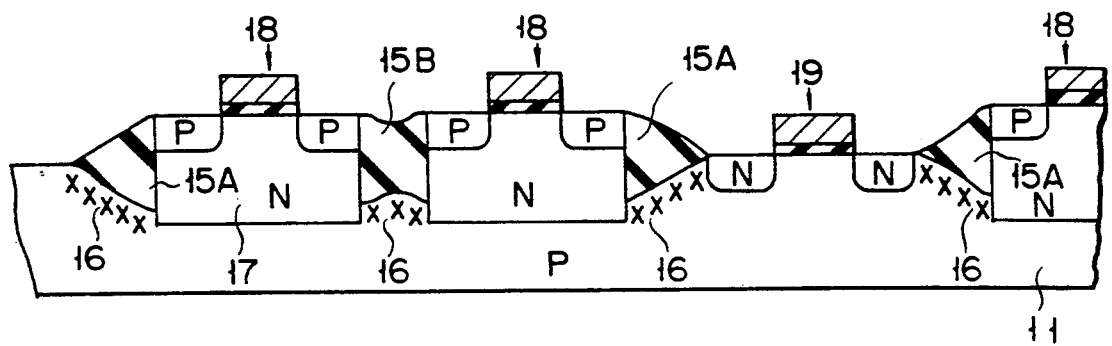
Figure 5:
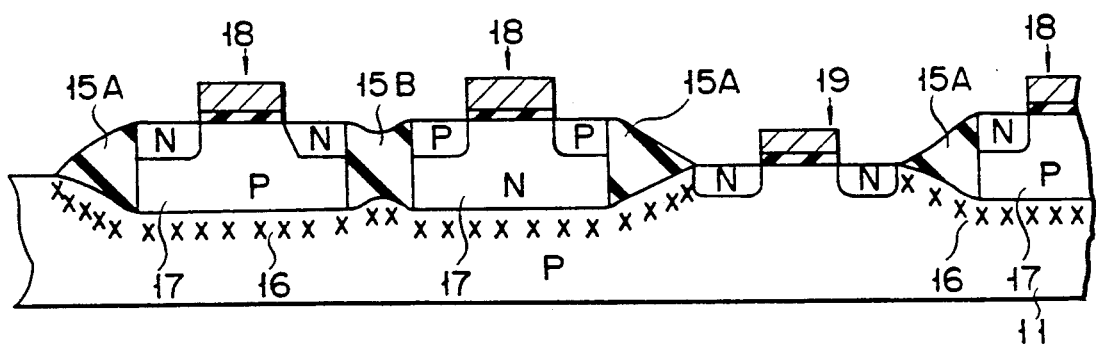
Figure 6:
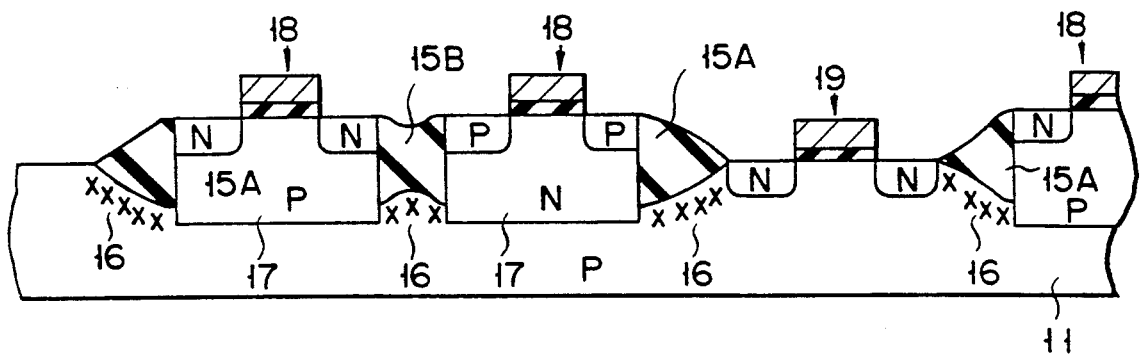

The present invention is not limited to the above embodiments. Various modifications can be made to this invention. In the above embodiments, P-type monocrystalline silicon layer 17 whose conductivity type is the same as that of substrate 11, is formed by the epitaxial growth technique. As shown in FIGS. 3 and 4, however, an N-type monocrystalline silicon layer whose conductivity type differs from that of substrate 11, can be formed and, in this case, N-type impurities such as phosphorus can be naturally substituted for P-type impurities as impurities mixed into a reactive gas. A MOS transistor formed in the monocrystalline silicon layer is of a p-channel type. The impurities can be doped not during but after the process of the epitaxial growth. Furthermore, impurities whose conductivity types differ from each other are selectively doped into a plurality of monocrystalline silicon layers 17 after the process of the epitaxial growth and, as illustrated in FIGS. 5 and 6, both N- and P-type monocrystalline silicon layers 17 can be formed. When the P-type monocrystalline silicon layer is formed, a monocrystalline silicon layer other than the P-type monocrystalline silicon layer is masked and P-type impurities, e.g., boron is ion-implanted on an acceleration voltage of about 100 KeV and at a dose of about $2 \times 10^{12}$ to $2 \times 10^{13}$/cm$^2$. When the N-type monocrystalline silicon layer is formed, a monocrystalline silicon layer other than the N-type monocrystalline silicon layer is masked and N-type impurities, e.g., phosphorus is ion-implanted on an acceleration voltage of about 100 KeV and at a dose of about $2 \times 10^{12}$ to $2 \times 10^{13}$/cm$^2$. After the ion-implantation of boron and phosphorus, the implanted ions are diffused by a thermal treatment. If masks having various shapes are selectively used at the time of the ion-implantation, an amount of ion-implantation into a monocrystalline silicon layer, i.e., an impurity concentration of a monocrystalline silicon layer differs from that of another monocrystalline silicon layer.

The above-described method of manufacturing a semiconductor device according to the present invention allows a minute element-isolating insulation film to be formed.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:
   forming on a surface of a semiconductor substrate a surface-protecting film of silicon oxide for protecting the surface of the semiconductor substrate;
   forming on said surface-protecting film an oxidation-resistance film of silicon nitride for preventing oxidation of said semiconductor substrate;
   selectively removing a portion of said oxidation-resistance film by photoetching to leave remaining portions thereof having a predetermined pattern;
   doping conductivity inversion preventing impurities into said semiconductor substrate, using the remaining portions of said oxidation-resistance film having said predetermined pattern as a mask;
   forming an element isolating oxide film on said semiconductor substrate so that ann inserting portion of said element isolating oxide film is formed under an end portion of said remaining portions of said oxidation-resistance film, by a selective oxidation technique using said remaining portions of said oxidation-resistance film having a predetermined pattern as a mask;
   removing a portion other than said inserting portion of said element isolating oxide film by anisotropic etching using said remaining portions of said oxidation-resistance film having a predetermined pattern as a mask, thereby selectively exposing said semiconductor substrate;

forming at least one monocrystalline silicon layer on the exposed portion of said semiconductor substrate;

removing said remaining portions of said oxidation-resistance film having a predetermined pattern and a portion of said surface-protecting film too selectively expose a portion of said semiconductor substrate; and forming semiconductor device elements in said monocrystalline silicon layer and in the exposed portion of said semiconductor substrate.

2. The method according to claim 1, wherein said monocrystalline silicon layer has the same conductivity type as that of said semiconductor substrate.

3. The method according to claim 1, wherein said monocrystalline silicon layer has a different conductivity type from that of said semiconductor substrate.

4. The method according to claim 1, wherein a plurality of monocrystalline silicon layers are formed with at least one thereof having the same conductivity type and at least one thereof having a different conductivity type from that of said semiconductor substrate.

5. The method according to claim 1, wherein said monocrystalline silicon layer is formed by an epitaxial growth technique.

6. The method according to claim 1, wherein said semiconductor substrate is a silicon substrate.

7. The method according to claim 6, wherein the thickness of said surface-protecting film is about 150 nm, the thickness of said oxidation-resistance film is about 250 nm, and the thickness of said element isolating insulation film is about 800 nm.

8. A method of manufacturing a semiconductor device, comprising the steps of:

forming on a surface of a semiconductor substrate a surface-protecting film of silicon oxide for protecting the surface of the semiconductor substrate;

forming on the surface-protecting film an oxidation-resistance film of silicon nitride for preventing oxidation of said semiconductor substrate;

selectively removing a portion of said oxidation-resistance film by photoetching to leave remaining portions thereof having a predetermined pattern;

doping conductivity inversion preventing impurities into said semiconductor substrate, using the remaining portions of said oxidation-resistance film having said predetermined pattern as a mask;

forming an element isolating oxide film on said semiconductor substrate so that an inserting portion of said element isolating oxide film is formed under ann end portion of said remaining portions of said oxidation-resistance film, by a selective oxidation technique using said remaining portions of said oxidation-resistance film having a predetermined pattern as a mask;

removing a portion other than said inserting portion of said element isolating oxide film by anisotropic etching using said remaining portions of said oxidation-resistance film having a predetermined pattern as a mask, thereby selectively exposing said semiconductor substrate;

selectively removing a portion of a layer of the semiconductor substrate into which said conductivity inversion preventing impurities are doped, by anisotropic etching using said remaining portions of said oxidation-resistance film having a predetermined pattern as a mask;

forming at least one monocrystalline silicon layer on the exposed portion of said semiconductor substrate;

removing said remaining portions of said oxidation-resistance film having a predetermined pattern and a portion of said surface-protecting film to selectively expose a portion of said semiconductor substrate; and forming semiconductor device elements in said monocrystalline silicon layer and in the exposed portion of said semiconductor substrate.

9. The method according to claim 8, wherein said monocrystalline silicon layer has the same conductivity type as that of said semiconductor substrate.

10. The method according to claim 8, wherein said monocrystalline silicon layer has a different conductivity type from that of said semiconductor substrate.

11. The method according to claim 8, wherein a plurality of monocrystalline silicon layers are formed with at least one thereof having the same conductivity type and at least one thereof having a different conductivity type from that of said semiconductor substrate.

12. The method according to claim 8, wherein said monocrystalline silicon layer is formed by an epitaxial growth technique.

13. The method according to claim 8, wherein said semiconductor substrate is a silicon substrate.

14. The method according to claim 13, wherein the thickness of said surface-protecting film is about $\frac{1}{2}$nm, the thickness of said oxidation-resistance film is about 250 nm, and the thickness of said element isolating insulation film is about 800 nm.

* * * * *

UNITED STATES PATENT AND TRADEMARK OFFICE
CERTIFICATE OF CORRECTION

PATENT NO. : 5,100,830
DATED : March 31, 1992
INVENTOR(S) : Shigeru Morita

It is certified that error appears in the above-identified patent and that said Letters Patent is hereby corrected as shown below:

Claim 1, column 6, line 59, change "ann" to --an--.

Claim 1, column 7, line 9, change "too" to --to--.

Claim 8, column 8, line 2, change "ann" to --an--.

Claim 14, column 8, line 48, change " $\frac{1}{8}$ " to --150--.

Signed and Sealed this

Twenty-eighth Day of September, 1993

Attest:

BRUCE LEHMAN

Attesting Officer

Commissioner of Patents and Trademarks